US012771319B2

(12) United States Patent
Matsuo et al.

(10) Patent No.: US 12,771,319 B2
(45) Date of Patent: Oct. 20, 2026

(54) RESONATOR ELEMENT AND QUARTZ CRYSTAL WAFER

(71) Applicant: SEIKO EPSON CORPORATION, Tokyo (JP)

(72) Inventors: Atsushi Matsuo, Shiojirir (JP); Katsuhiko Maki, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 598 days.

(21) Appl. No.: 18/474,691

(22) Filed: Sep. 26, 2023

(65) Prior Publication Data

US 2024/0113687 A1 Apr. 4, 2024

(30) Foreign Application Priority Data

Sep. 28, 2022 (JP) ................................ 2022-154649

(51) Int. Cl.
*H03H 9/19* (2006.01)
*H03H 9/05* (2006.01)
*H03H 9/13* (2006.01)

(52) U.S. Cl.
CPC ............ *H03H 9/19* (2013.01); *H03H 9/0595* (2013.01); *H03H 9/13* (2013.01)

(58) Field of Classification Search
CPC .......... H03H 9/19; H03H 9/0595; H03H 9/13; H03H 9/02023
See application file for complete search history.

(56) References Cited

U.S. PATENT DOCUMENTS

| | | | | |
|---|---|---|---|---|
| 861,067 A * | 7/1907 | Waugh | E02D 17/04 16/13 |
| 3,872,411 A * | 3/1975 | Watanabe | H03H 9/19 29/25.35 |
| 4,441,826 A * | 4/1984 | Morokawa | G05F 3/247 968/933 |

(Continued)

FOREIGN PATENT DOCUMENTS

| | | |
|---|---|---|
| JP | 2010-62793 A | 3/2010 |
| JP | 2013-128273 A | 6/2013 |

(Continued)

*Primary Examiner* — Pedro J Cuevas
(74) *Attorney, Agent, or Firm* — Rankin, Hill & Clark LLP

(57) ABSTRACT

A resonator element includes an AT-cut quartz crystal substrate having a first surface that is a front surface and a second surface that is a rear surface with respect to the front surface, the two surfaces extending along the axes X and Z' of a quartz crystal, and further having side surfaces that link the first and second surfaces to each other, a first excitation electrode disposed at the first surface, a first extraction electrode disposed at the first surface and coupled to the first excitation electrode, a second excitation electrode disposed at the second surface, and a second extraction electrode disposed at the second surface and coupled to the second excitation electrode. The side surfaces include a first side surface located at one side of the direction of the axis X, and second and third side surfaces that intersect with the first side surface. At least one of the first and second extraction electrodes is disposed at and extends along the first side surface. At least one of the second and third side surfaces has a fracture surface.

9 Claims, 10 Drawing Sheets

(56) References Cited

U.S. PATENT DOCUMENTS 4,451,755 A * 5/1984 Vig .......................... H03H 9/19 310/312
5,136,817 A * 8/1992 Tabata .................... B24B 49/04 451/291
6,952,074 B2 * 10/2005 Nagaura ............ H03H 9/02157 310/369
7,135,938 B2 * 11/2006 Makuta ................ H03H 9/0547 331/116 R
7,423,363 B2 * 9/2008 Tanaka ................. H03H 9/0595 310/368
8,026,652 B2 * 9/2011 Yasuike ............. H03H 9/02102 310/368
8,084,926 B2 * 12/2011 Naito ....................... H03H 9/19 310/348
8,299,689 B2 * 10/2012 Yasuike ............. H03H 9/02133 310/368
8,424,746 B2 * 4/2013 Adachi ................... C22C 45/00 65/36
8,653,722 B2 * 2/2014 Mizusawa ............ H03H 9/0595 29/25.35
8,779,652 B2 * 7/2014 Mizusawa ................ H03H 9/19 310/320
11,177,429 B2 * 11/2021 Matsuo .................... H03B 5/32
2003/0132811 A1 * 7/2003 Nagaura .................. H03H 3/02 331/158
2006/0016065 A1 * 1/2006 Nagaura .................. H03H 3/02 29/609.1
2006/0192464 A1 * 8/2006 Tanaka ................. H03H 9/0595 310/351
2009/0167117 A1 * 7/2009 Yasuike ............... H03H 9/0552 29/25.35
2010/0136306 A1 * 6/2010 Adachi ................... C22C 45/00 428/212
2011/0304406 A1 * 12/2011 Yasuike ............ H03H 9/02133 331/158
2012/0032562 A1 * 2/2012 Mizusawa ................ H03H 3/04 29/25.35
2012/0032563 A1 * 2/2012 Shimao .............. H03H 9/02157 310/344
2012/0056514 A1 * 3/2012 Ishikawa ............ H03H 9/02157 310/353

FOREIGN PATENT DOCUMENTS

JP 2013-157838 A 8/2013
JP 2014-192797 A 10/2014
JP 2016-152476 A 8/2016

* cited by examiner

RESONATOR ELEMENT AND QUARTZ CRYSTAL WAFER

The present application is based on, and claims priority from JP Application Serial Number 2022-154649, filed Sep. 28, 2022, the disclosure of which is hereby incorporated by reference herein in its entirety.

BACKGROUND

1. Technical Field

The present disclosure relates to a resonator element and a quartz crystal wafer.

2. Related Art

JP-A-2016-152476 discloses that a wafer includes a plurality of resonator pieces coupled to a support frame via snap-off portions, and that the snap-off portions are cut to separate the plurality of resonator pieces into individual elements. The wafer has excitation electrodes and extraction electrodes connected to the excitation electrodes. The extraction electrodes are routed along the side surfaces where the snap-off portions are formed.

JP-A-2016-152476 is an example of the related art.

However, in the technology described in JP-A-2016-152476, in which the extraction electrodes and the snap-off portions are on the same side surfaces, the routed portions of the extraction electrodes may undesirably peel off when the resonator pieces are cut into individual elements. Furthermore, when the snap-off portions are present in the direction in which the resonator pieces perform thickness shear vibration, burrs or other unwanted defects resulting from the cutting operation undesirably affect the vibration characteristics.

SUMMARY

A resonator element includes an AT-cut quartz crystal substrate having a first surface that is a front surface and a second surface that is a rear surface with respect to the front surface, the first and second surfaces extending along axes X and Z' of a quartz crystal, and further having side surfaces that link the first and second surfaces to each other, a first excitation electrode disposed at the first surface, a first extraction electrode disposed at the first surface and coupled to the first excitation electrode, a second excitation electrode disposed at the second surface, and a second extraction electrode disposed at the second surface and coupled to the second excitation electrode. The side surfaces include a first side surface located at one side of a direction of the axis X, and second and third side surfaces that intersect with the first side surface. At least one of the first and second extraction electrodes is disposed at and extends along the first side surface. At least one of the second and third side surfaces has a fracture surface.

A quartz crystal wafer includes a plurality of resonator elements that each include an AT-cut quartz crystal substrate having a first surface that is a front surface and a second surface that is a rear surface with respect to the front surface, the first and second surfaces extending along axes X and Z' of a quartz crystal, and further having side surfaces that link the first and second surfaces to each other, a first excitation electrode disposed at the first surface, a first extraction electrode disposed at the first surface and coupled to the first excitation electrode, a second excitation electrode disposed at the second surface, and a second extraction electrode disposed at the second surface and coupled to the second excitation electrode, a support frame, and a plurality of holders that couple the resonator elements to the support frame. The side surfaces of each of the resonator elements include a first side surface located at one side of a direction of the axis X, and second and third side surfaces that intersect with the first side surface. At least one of the first and second extraction electrodes is disposed at and extends along the first side surface. The holders are disposed at a side facing at least one of the second and third side surfaces.

DESCRIPTION OF EMBODIMENTS

Figure 1:
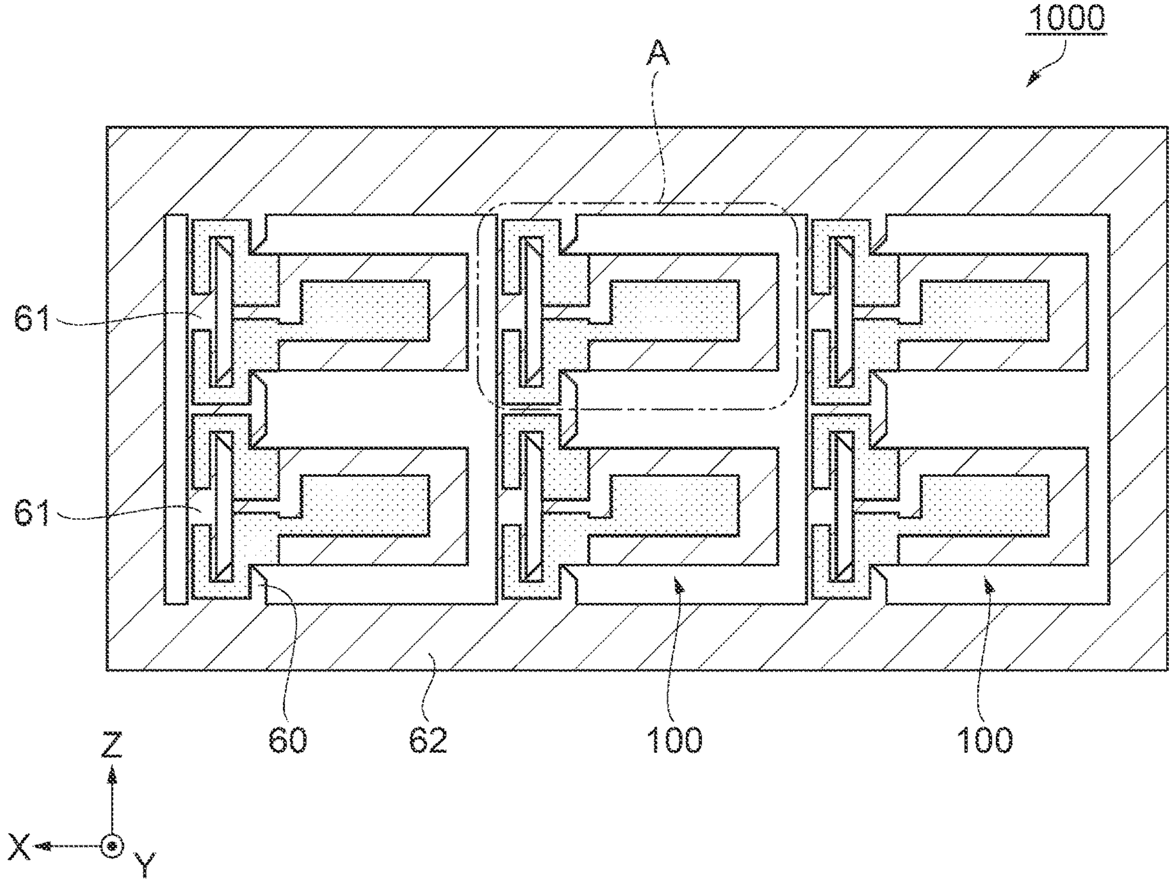
FIG. 1 is a plan view showing the configuration of a quartz crystal wafer including resonator elements.

In the drawings below, the description will be made by using three axes called axes X, Y, and Z perpendicular to one another. The direction along the axis X is called a "direction X", the direction along the axis Y is called a "direction Y", and the direction along the axis Z is called a "direction Z", with the direction indicated by the arrow is the direction toward the positive end of the axis, and the direction opposite the direction toward the positive end is the direction toward the negative end of the axis. The direction toward the positive end of the direction Y is also called "upper" or "upward", and the direction toward the negative end of the direction Y is also called "lower" or "downward" in some cases, and views in the directions toward the positive and negative ends of the direction Y are each also called a plan view or planar. The description will be made on the assumption that a surface facing the positive end of the direction Y is called an upper surface, and that a surface facing the negative end of the direction Y, which is a surface opposite from the upper surface, is called a lower surface.

A quartz crystal wafer 1000 including a plurality of resonator elements 100 will first be described with reference to FIGS. 1 and 2.

Figure 2:
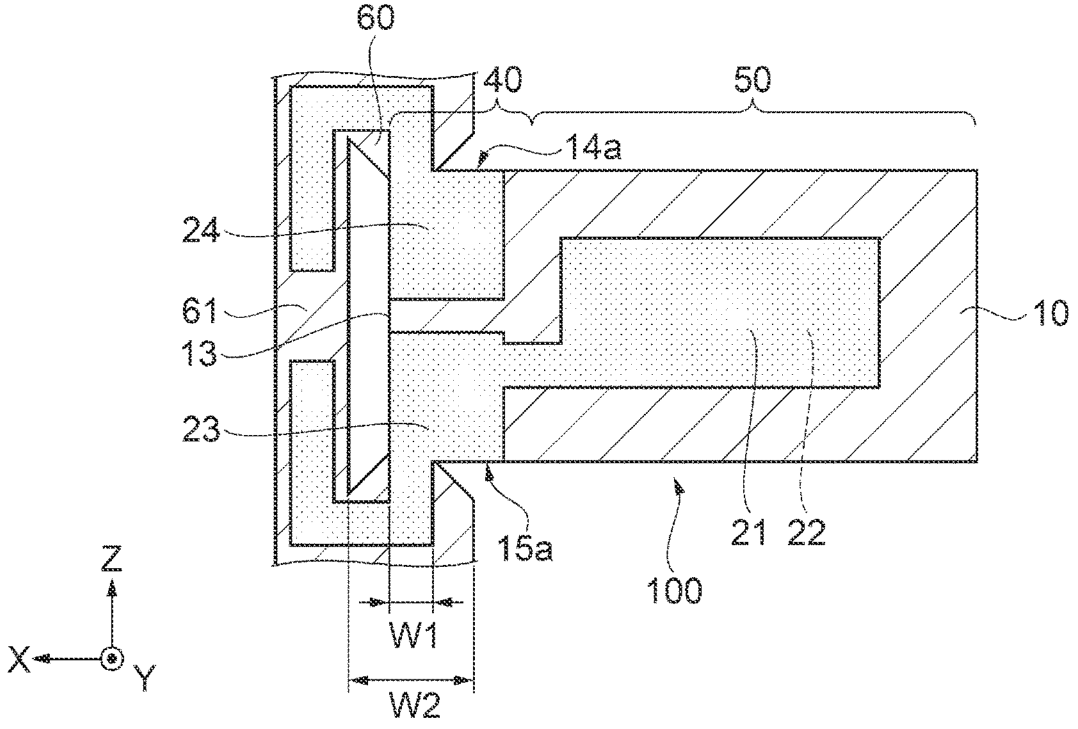
FIG. 2 is an enlarged plan view of the portion A of the quartz crystal wafer shown in FIG. 1.

FIGS. 1 and 2 show the state of the quartz crystal wafer 1000 in which the plurality of resonator elements 100 are coupled to a quartz crystal substrate, in other words, the state before the resonator elements 100 are cut into individual elements. The quartz crystal wafer 1000 includes the resonator elements 100, which each include a support section 40 and a resonator element section 50 arranged along the direction X, and holders 60, which are each coupled to end sections 14*a* and 15*a* of the support section 40, which face in the direction Z, as shown in FIG. 2.

The quartz crystal wafer 1000 includes a plurality of resonator elements 100 arranged along the direction X and a plurality of resonator elements 100 arranged along the direction Z. The holders 60 are each coupled to the end sections 14*a* and 15*a* of the corresponding resonator element 100. The holders 60 and 60 adjacent to each other in the direction Z are coupled to each other via a linkage section 61. The holders 60 and 60 adjacent to each other in the direction X are coupled to a support frame 62.

A portion of a first extraction electrode 23 and a portion of a second extraction electrode 24 are disposed at the upper surface of the linkage section 61. Electrical inspection can, for example, be performed without direct contact of terminals with the extraction electrodes 23 and 24, so that damage to the extraction electrodes 23 and 24 can be suppressed. In addition, the strength of the holder 60 can be improved, enabling stable handling of the quartz crystal wafer 1000. Furthermore, the quartz crystal wafer 100 can be manufactured in a stable manner until the step of cutting the quartz crystal wafer 1000 into individual elements.

The configuration of each of the resonator elements 100 will next be described with reference to FIGS. 3 and 4.

Figure 3:
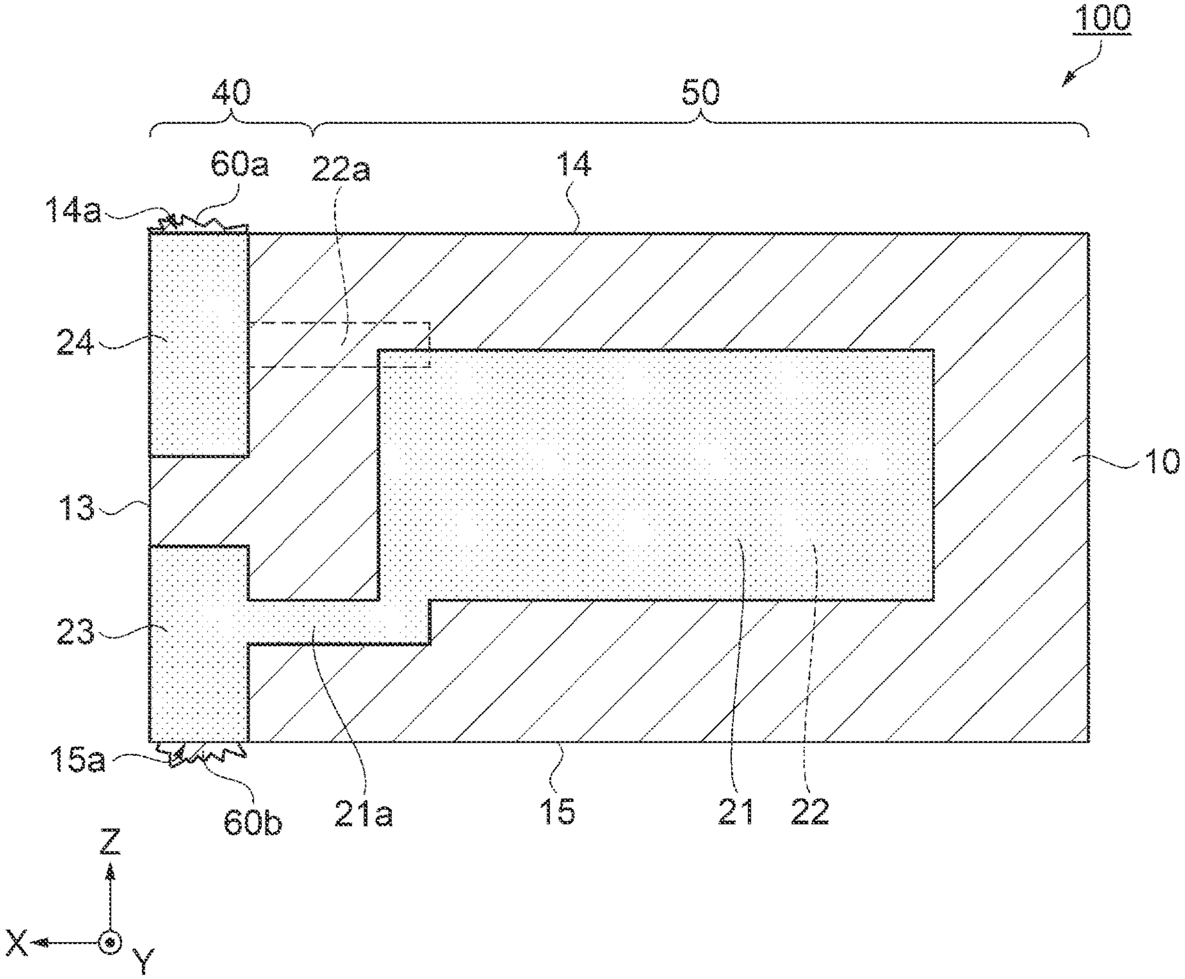
FIG. 3 is a plan view showing the configuration of a resonator element.
Figure 4:
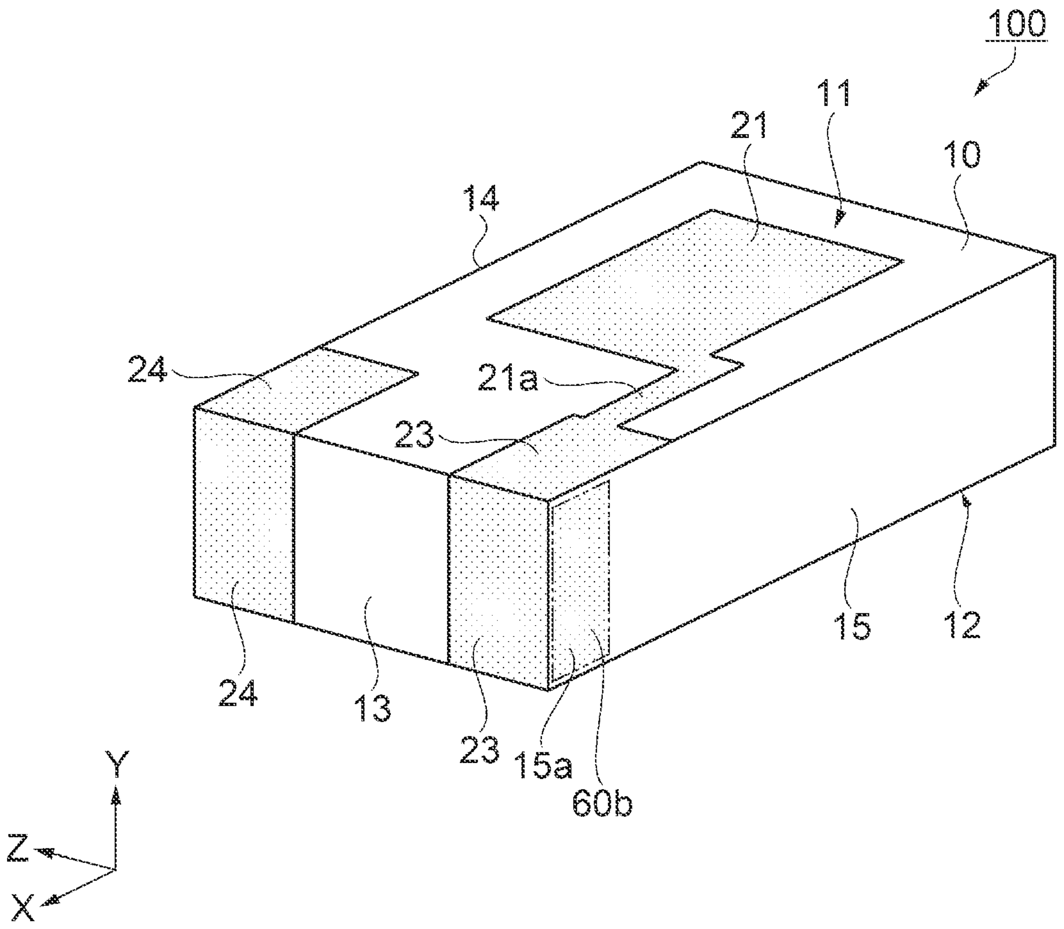
FIG. 4 is a perspective view showing the configuration of the resonator element.

The resonator elements 100 each include a resonator piece 10, as shown in FIGS. 3 and 4. The resonator piece 10 is, for example, an AT-cut quartz crystal substrate. The resonator piece 10 has a first surface 11, which is a front surface, and a second surface 12, which is a rear surface with respect to the front surface, and side surfaces 13, 14, and 15, which link the first surface 11 and the second surface 12 to each other. A first excitation electrode 21 is disposed at the first surface 11. A second excitation electrode 22 is disposed at the second surface 12 so as to coincide with the first excitation electrode 21 in the plan view.

The first extraction electrode 23 electrically coupled to the first excitation electrode 21 is further disposed at the first surface 11. The second extraction electrode 24 electrically coupled to the second excitation electrode 22 is disposed at the second surface 12. The resonator elements 100 are coupled to the support frame 62 via the plurality of holders 60, as described above.

The side surfaces 13, 14, and 15 of each of the resonator elements 100 include a first side surface 13 located at one side of the direction of the axis X, in other words, a first side surface 13, which is one of the side surfaces along the axis Z, and a second side surface 14 and a third side surface 15, which intersect with the first side surface 13. In the present embodiment, both the first extraction electrode 23 and the second extraction electrode 24 are disposed at and extend along the first side surface 13. The second side surface 14 and the third side surface 15 are each provided with the corresponding holder 60 (see FIGS. 1 and 2).

The resonator piece 10 is made of any of a variety of piezoelectric materials, including a quartz crystal element as a representative example. The resonator piece 10 is an AT-cut quartz crystal element. In the present embodiment, the vibration element 10 is an AT-cut quartz crystal element having a quadrangular planar shape, specifically, a rectangular planar shape. The directions toward the positive ends of the axes X, Y, and Z in FIGS. 3 and 4 therefore coincide with the directions toward the positive ends of axes X, Y', and Z' that are the crystallographic axes of quartz crystal, respectively. That is, the first surface 11 and the second surface 12 of the resonator piece 10 are formed along the axes X and Z' of the quartz crystal. The definition described above is not necessarily employed, and the direction toward the positive end of at least one of the axes X, Y, and Z may coincide with the direction toward the negative end of the corresponding axis.

The resonator piece 10 includes the resonator section 50, the support section 40, which is disposed at a distance from the resonator section 50, and coupling wiring lines 21*a* and 22*a*, which couple the resonator section 50 to the support section 40.

The first excitation electrode 21 is electrically coupled to the first extraction electrode 23 via the coupling wiring line 21*a*. The second excitation electrode 22 is electrically coupled to the second extraction electrode 24 via the coupling wiring line 22*a*. Specifically, the first extraction electrode 23 is provided at the support section 40 and is electrically coupled to the first excitation electrode 21. The second extraction electrode 24 is provided at the support section 40 and is electrically coupled to the second excitation electrode 22.

The end section 14*a* of the second side surface 14 of the resonator element 100 is provided, for example, with a fracture section 60*a*, which is formed when the resonator elements 100 are cut into individual elements from the quartz crystal wafer 1000, as shown in FIGS. 3 and 4. That is, the end section 14*a* is the fracture surface formed when the resonator elements 100 are cut into individual elements. The end section 15*a* of the third side surface 15 of the resonator element 100 is provided, for example, with a fracture section 60*b*, which is formed when the resonator elements 100 are cut into individual elements from the quartz crystal wafer 1000. That is, the end section 15*a* is the fracture surface formed when the resonator elements 100 are cut into individual elements.

The configuration in which the first extraction electrode 23 and the second extraction electrode 24 extend along the first side surface 13 and the second side surface 14 and the third side surface 15, which intersect with the first side surface 13, each have the fracture surface causes the extensions of the extraction electrodes 23 and 24 to be located at a surface different from the fracture surfaces. Therefore, for example, when the resonator elements 100 are cut into individual elements from the quartz crystal wafer 1000, the effect of burrs, peels, or other unwanted defects resulting from the cutting operation on the first extraction electrode 23 and the second extraction electrode 24 can be suppressed. Satisfactory vibration characteristics of the resonator elements 100 can therefore be maintained.

A method for manufacturing the resonator element 100 will next be described with reference to FIGS. 5 to 7.

Figure 5:
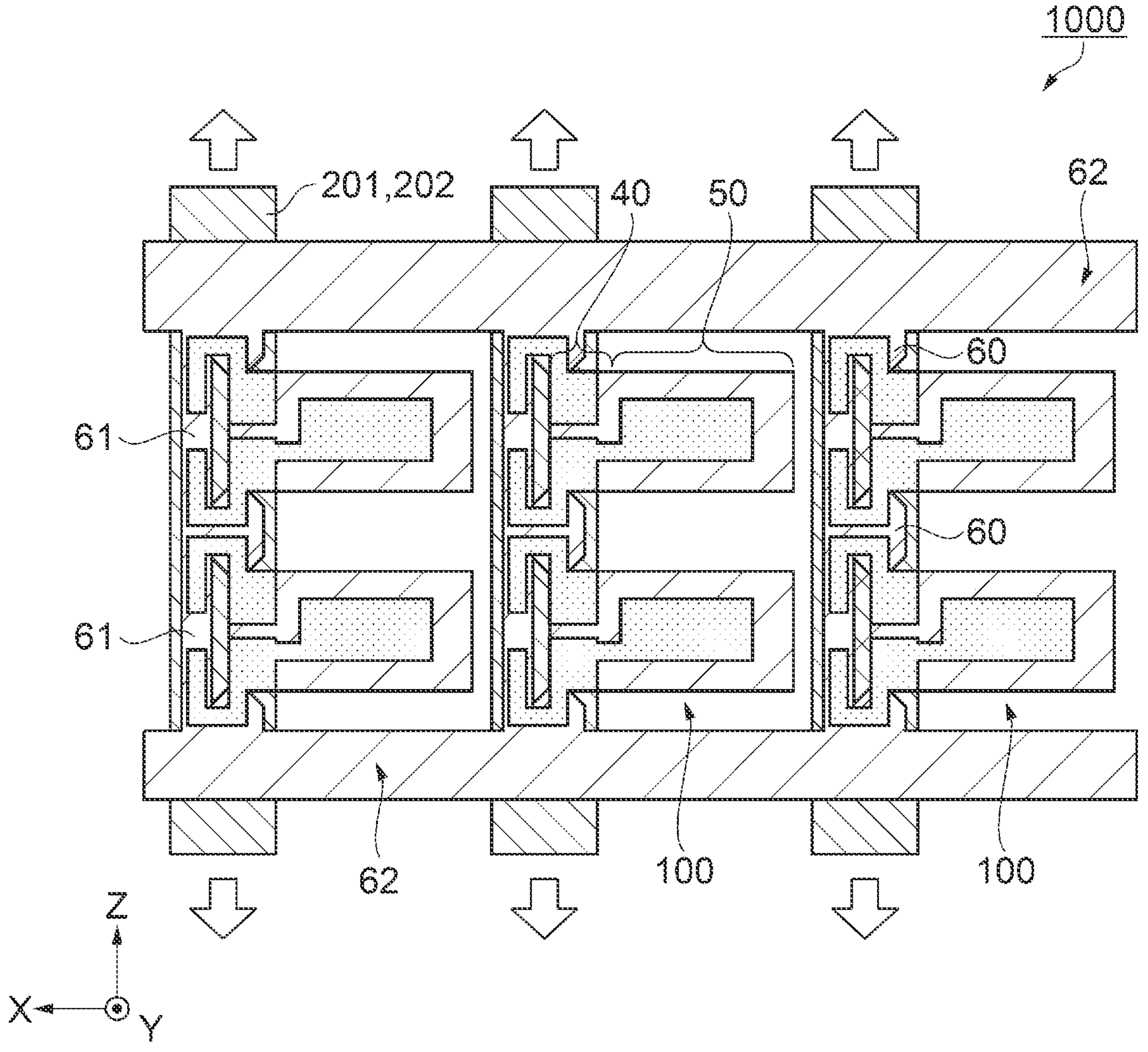
FIG. 5 is a plan view showing part of a method for manufacturing the resonator element.
Figure 6:
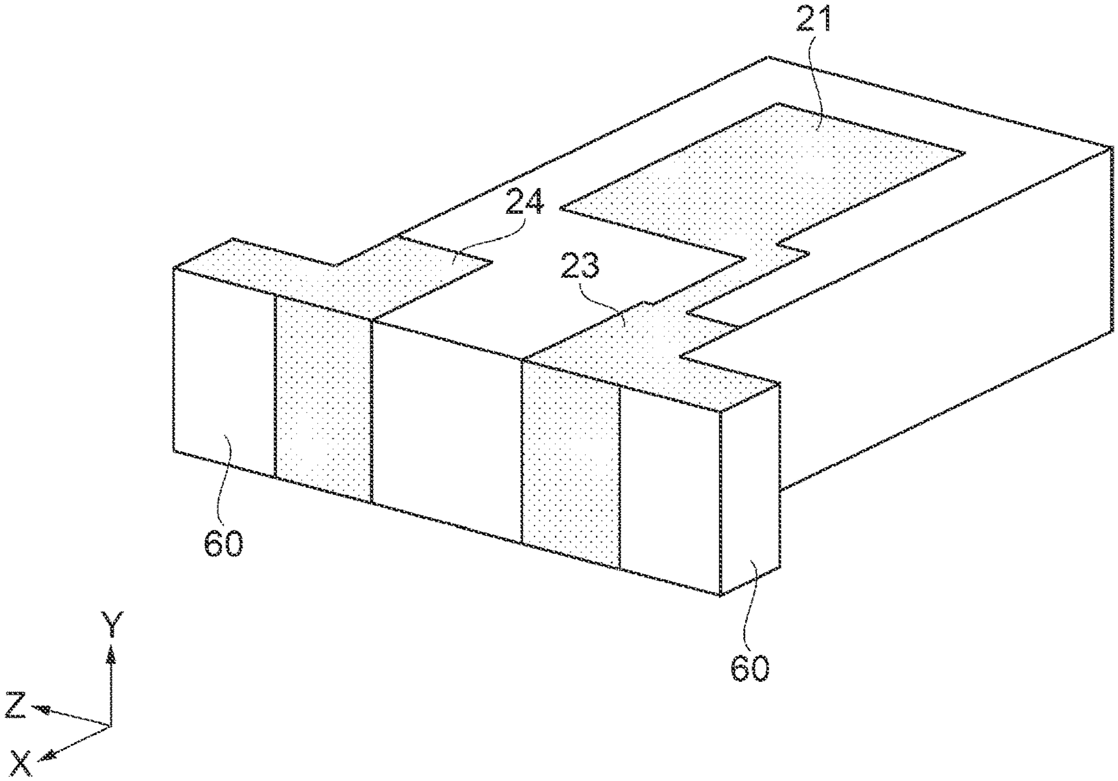
FIG. 6 is a perspective view showing part of the method for manufacturing the resonator element.

First, in the process shown in FIGS. 5 and 6, the quartz crystal wafer 1000 including the plurality of resonator elements 100 is prepared. The quartz crystal wafer 1000 includes the resonator elements 100, which each include the support section 40 and the resonator section 50 arranged along the direction X, and the holders 60, which are each coupled to the end sections 14*a* and 15*a* of the support section 40, which face in the direction Z, as described above. The quartz crystal wafer 1000 includes the plurality of resonator elements 100 arranged in the directions X and Z.

The quartz crystal wafer 1000 has been so hollowed out, for example, by photolithography and etching techniques that the outer shape of the resonator elements 100 are separate from each other, as shown in FIG. 5. The quartz crystal wafer 1000 is provided with the linkage sections 61, which link the plurality of holders 60 to each other in the direction Z.

At least the support sections 40 and the holders 60 of the quartz crystal wafer 1000 are then fixed to films 202 via an adhesive 201, as shown in FIG. 5. Specifically, the films 202 are each fixed to the region of the second surface 12 that overlaps with the support section 40 via the adhesive 201. Examples of the adhesive 201 may include rubber-based, acrylic, urethane-based, and silicone-based adhesives. Examples of the film 202 may include a plastic film.

Figure 7:
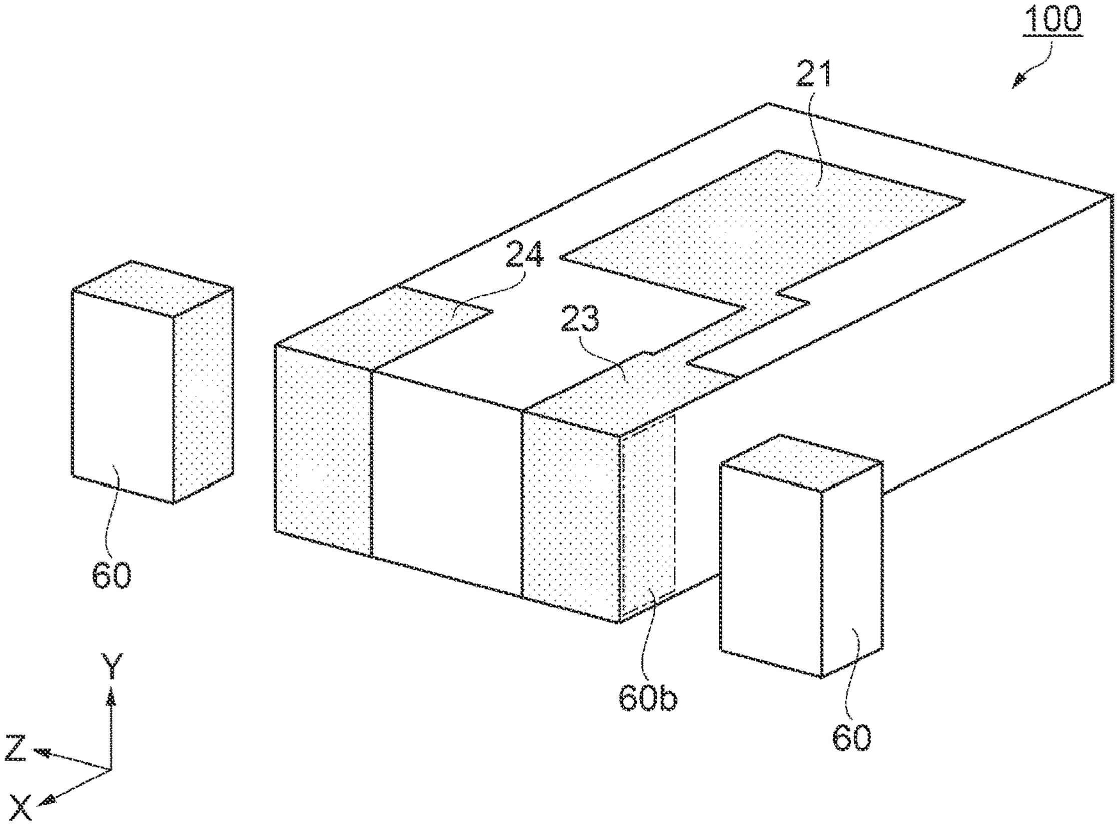
FIG. 7 is a perspective view showing part of the method for manufacturing the resonator element.

Thereafter, in the steps shown in FIGS. 5 and 7, the plurality of resonator elements 100 are simultaneously cut into individual elements from the quartz crystal wafer 1000. Specifically, the quartz crystal wafer 1000, specifically the films 202 are stretched along the direction Z. As a result, the portions where the resonator elements 100 coupled to each other are coupled to the holders 60 are pulled and fractured, as shown in FIG. 7. The coupled portions are thus separated from the plurality of resonator elements 100, and the resonator elements 100 are simultaneously cut into individual elements. The individualization method is referred to as an expansion method. The configuration in which the support frame 62 is formed only of portions extending along the direction X as shown in FIG. 5 allows the films 202 to be readily stretched, so that the resonator elements 100 can be efficiently cut into individual elements.

The width of each of the holders 60 along the direction that intersects with the first side surface 13 is preferably so set that a width W1 at the portion coupled to the resonator element 100 is minimized, as shown in FIG. 2. Specifically, the width W1 of the coupling portion of each of the holders 60, where the end sections 14*a* and 15*a* are coupled to the holder 60, is smaller than a width W2 of the other portion of the holder 60, so that cracks are more likely to occur at the coupling portion when the films 202 are pulled in the direction Z. The entire coupling portions are thus likely to fracture, and the resonator elements 100 can be readily cut into individual elements.

The adhesive 201, which is placed to the support sections 40 and the holders 60, may be placed only at the portions in contact with the support sections 40 and the holders 60, or at the entire surface of the films 202.

As described above, the resonator element 100 according to the present embodiment includes an AT-cut quartz crystal substrate having the first surface 11, which is the front surface, and the second surface 12, which is the rear surface with respect to the front surface, the two surfaces extending along the axes X and Z' of the quartz crystal, and further having side surfaces that link the first surface 11 and the second surface 12 to each other, the first excitation electrode 21 disposed at the first surface 11, the first extraction electrode 23 disposed at the first surface 11 and coupled to the first excitation electrode 21, the second excitation electrode 22 disposed at the second surface 12, and the second extraction electrode 24 disposed at the second surface 12 and coupled to the second excitation electrode 22. The side surfaces include the first side surface 13 located at one side of the direction of the axis X of the quartz crystal, and the second side surface 14 and the third side surface 15, which intersect with the first side surface 13. At least one of the first extraction electrode 23 and the second extraction electrode 24 is disposed at and extends along the first side surface 13. At least one of the second side surface 14 and the third side surface 15 has a fracture surface.

According to the configuration described above, the first extraction electrode 23 and the second extraction electrode 24 extend along the first side surface 13, and the second side surface 14 and the third side surface 15, which intersect with the first side surface 13, each have a fracture surface, so that the extensions of the extraction electrodes 23 and 24 are located at a surface different from the fracture surfaces. Therefore, for example, when the resonator elements 100 are cut into individual elements, the effect of burrs, peels, or other defects resulting from the cutting operation on the first extraction electrode 23 and the second extraction electrode 24 can be suppressed. Satisfactory vibration characteristics of the resonator elements 100 can therefore be maintained.

In the resonator element 100 according to the present embodiment, it is preferable that the second side surface 14 and the third side surface 15 each have the fracture surface. According to the configuration described above, the second side surface 14 and the third side surface 15 each have a fracture surface, and the fracture surfaces are located at a surface different from the first side surface 13. Therefore, for example, when the resonator elements 100 are cut into individual elements, the effect of the cutting operation on the first extraction electrode 23 and the second extraction electrode 24 can be suppressed.

In the resonator element 100 according to the present embodiment, it is preferable that the first extraction electrode 23 and the second extraction electrode 24 extend along the first side surface 13, and that the second side surface 14 and the third side surface 15 each have the fracture surface. According to the configuration described above, even when the first extraction electrode 23 and the second extraction electrode 24 each extend along the first side surface 13, and the second side surface 14 and the third side surface 15 each have a fracture surface, the extensions of the extraction electrodes 23 and 24 are located at a side surface different from the side surfaces having the fracture surfaces, so that the effect of the cutting operation on the first extraction electrode 23 and the second extraction electrode 24 can be suppressed.

The quartz crystal wafer 1000 according to the present embodiment includes the plurality of resonator elements 100, which each include the AT-cut quartz crystal substrate having the first surface 11, which is the front surface, and the second surface 12, which is the rear surface with respect to the front surface, the two surfaces extending along the axes X and Z' of the quartz crystal, and further having side surfaces that link the first surface 11 and the second surface 12 to each other, the first excitation electrode 21 disposed at the first surface 11, the first extraction electrode 23 disposed at the first surface 11 and coupled to the first excitation electrode 21, the second excitation electrode 22 disposed at the second surface 12, and the second extraction electrode 24 disposed at the second surface 12 and coupled to the second excitation electrode 22, the support frame 62, and the plurality of holders 60, which couple the resonator elements 100 to the support frame 62. The side surfaces of each of the resonator elements 100 include the first side surface 13 located at one side of the direction of the axis X of the quartz crystal, and the second side surface 14 and the third side surface 15, which intersect with the first side surface 13. At least one of the first extraction electrode 23 and the second extraction electrode 24 is disposed at and extends along the first side surface 13. The holders 60 are disposed at the side facing at least one of the second side surface 14 and the third side surface 15.

According to the configuration described above, even when the first extraction electrode 23 and the second extraction electrode 24 extend along the first side surface 13, and the holders 60 are disposed at the second side surface 14 and the third side surface 15, which intersect with the first side surface 13, the extensions of the extraction electrodes 23 and 24 are located at a side surface different from the side surface where the holders 60 are located. For example, when the holders 60 are fractured to cut the resonator elements 100 into individual elements from the quartz crystal wafer 1000, the effect of burrs, peels, or other defects resulting from the cutting operation on the first extraction electrode 23 and the second extraction electrode 24 can be suppressed. Satisfactory vibration characteristics of the resonator elements 100 can therefore be maintained.

In the quartz crystal wafer 1000 according to the present embodiment, it is preferable that the holders 60 are disposed at the sides facing the second side surface 14 and the third side surface 15 of each of the resonator elements 100. According to the configuration described above, the holders 60 are disposed at both the second side surface 14 and the third side surface 15, in other words, the resonator elements 100 are disposed at opposite sides of each of the holders 60, so that a plurality of resonator elements 100 can be arranged along a direction that intersects with the direction of the axis X of the quartz crystal. As a result, stretching the quartz crystal wafer 1000 in the direction that intersects with the direction of the axis X allows the plurality of resonator elements 100 to be readily cut into individual elements, thus enabling the individualization using the expansion method.

In the quartz crystal wafer 1000 according to the present embodiment, it is preferable that the first extraction electrode 23 and the second extraction electrode 24 extend along the first side surface 13, and that the holders 60 are disposed at the sides facing the second side surface 14 and the third side surface 15. According to the configuration described above, the holders 60 are disposed at both the second side surface 14 and the third side surface 15, in other words, the resonator elements 100 are disposed at opposite sides of each of the holders 60, so that a plurality of resonator elements 100 can be arranged along a direction that intersects with the direction of the axis X of the quartz crystal. As a result, stretching the quartz crystal wafer 1000 in the direction that intersects with the direction of the axis X allows the plurality of resonator elements 100 to be readily cut into individual elements, thus enabling the individualization using the expansion method.

In the quartz crystal wafer 1000 according to the present embodiment, it is preferable that the width of each of the holders 60 along a direction that intersects with the first side surface 13 is so set that the portion of the holder 60 that is coupled to the resonator element 100 (width W1 in FIG. 2) is minimized. According to the configuration described above, since the portion of each of the holders 60 that is coupled to the resonator elements 100 is the thinnest portion, the coupled portion is readily fractured, and the resonator elements 100 can be readily cut into individual elements.

Variations of the embodiment described above will be described below.

Figure 8:
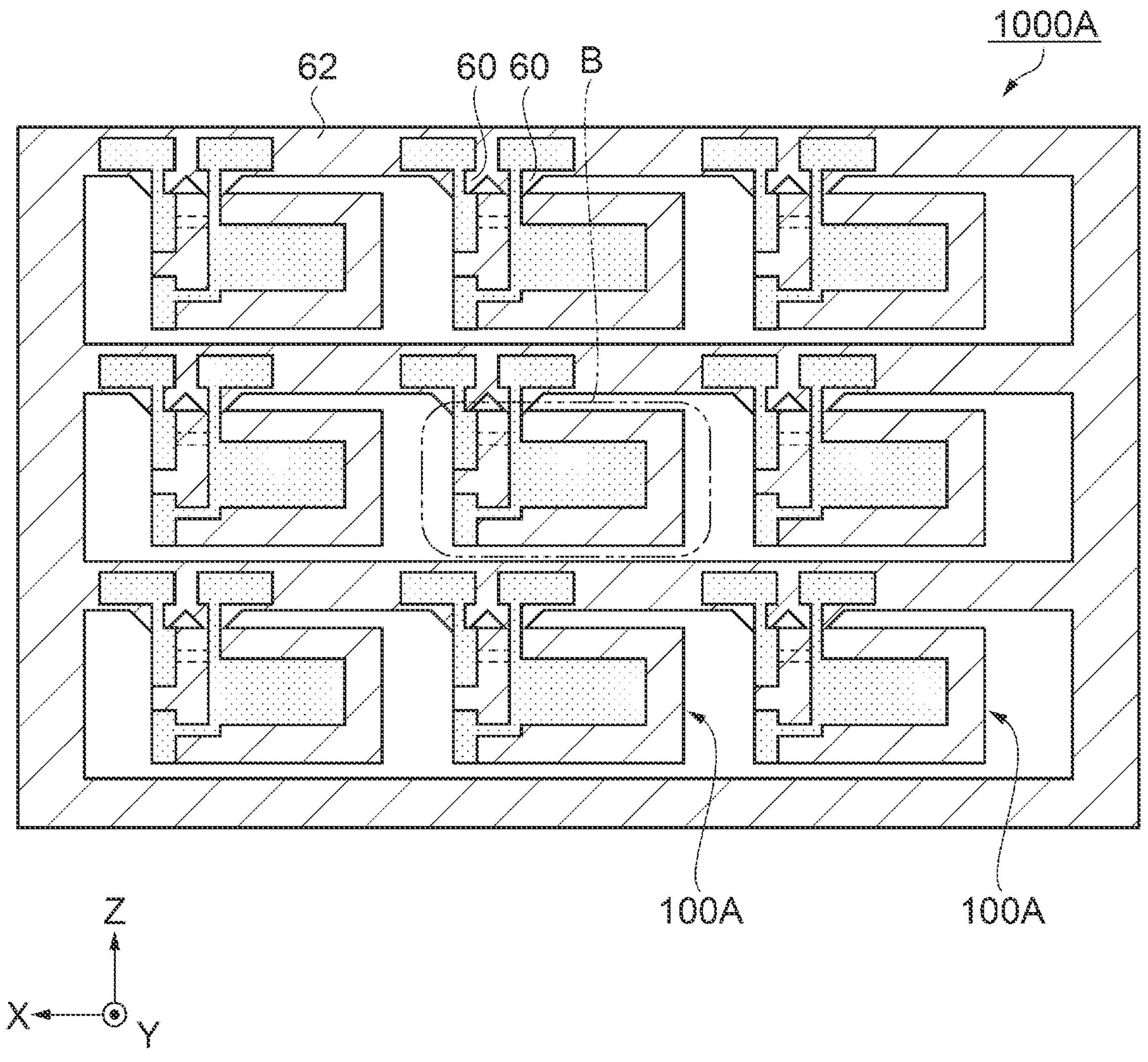
FIG. 8 is a plan view showing the configuration of the quartz crystal wafer according to a variation.
Figure 9:
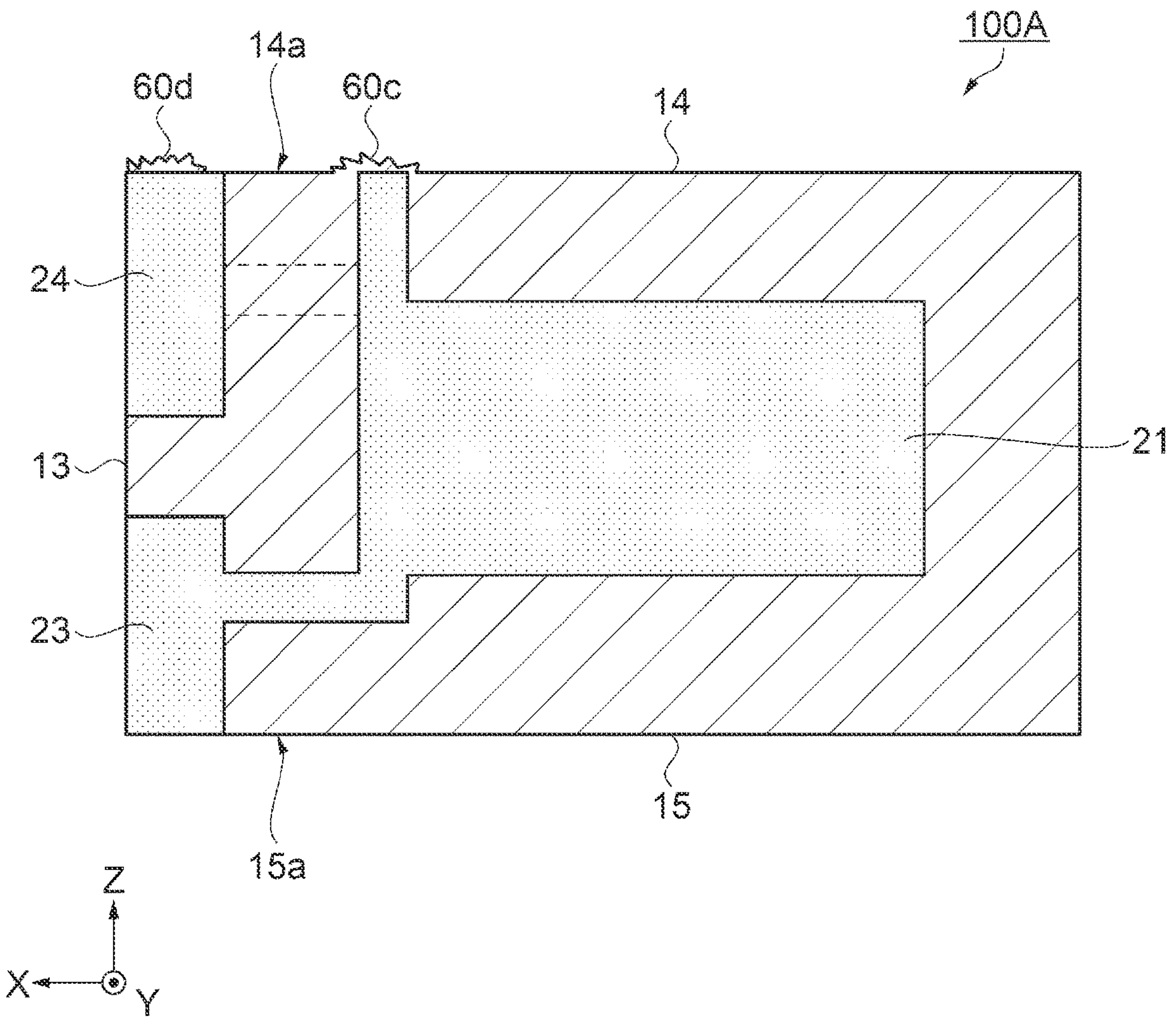
FIG. 9 is an enlarged plan view of the portion B of the quartz crystal wafer according to the variation shown in FIG. 8.
Figure 10:
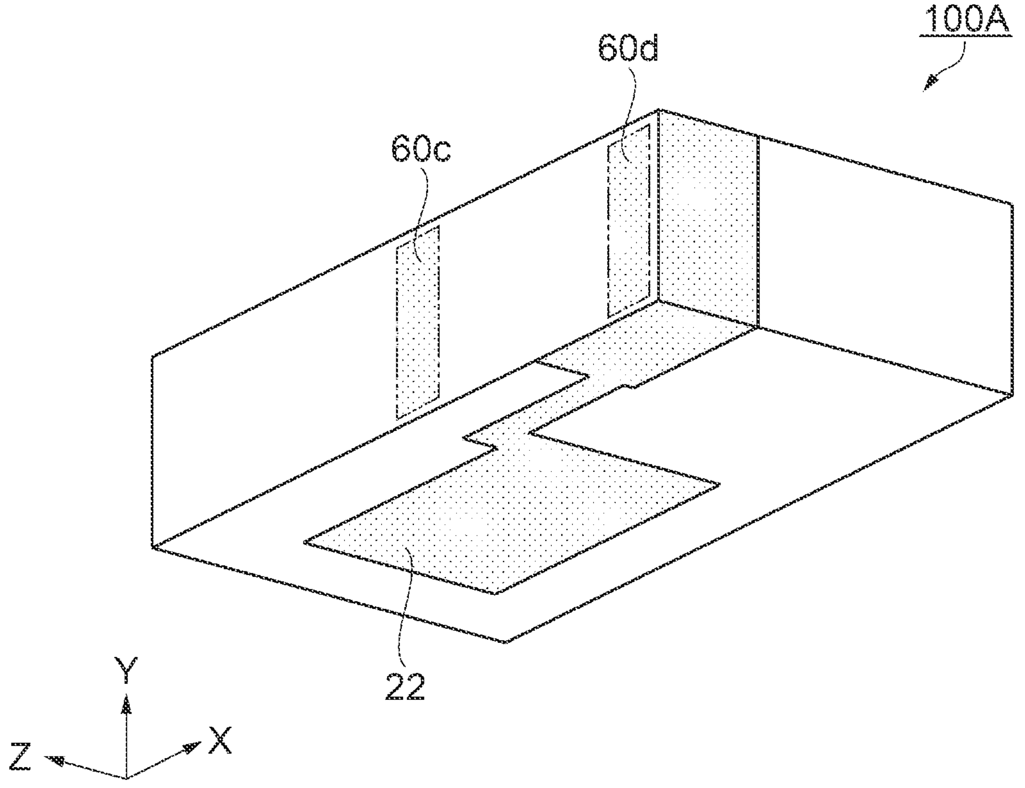
FIG. 10 is a perspective view showing the configuration of the resonator element according to the variation.

The second side surface 14 and the third side surface 15 do not each necessarily have a fracture surface, unlike the above description, and either of the side surfaces may have a fracture surface, as shown in FIGS. 8 to 10.

Specifically, in a crystal wafer 1000A according to a variation, two holders 60 are coupled to the second side surface 14 of each resonator element 100A, as shown in FIGS. 8 and 9. The resonator elements 100A are each coupled in the form of what is called a cantilever to the support frame 62. The first extraction electrode 23 and the second extraction electrode 24 are disposed at and extend along the support frame 62 at the side facing the second side surface 14.

When the resonator elements 100A are cut into individual elements from the thus configured quartz crystal wafer 1000A, the end section 14*a* of the second side surface 14 has fracture surfaces. Fracture sections 60*c* and 60*d* may be produced at the end section 14*a* of each of the resonator elements 100A, as shown in FIGS. 9 and 10. Only the second side surface 14 does not necessarily have the fracture surfaces, and only the third side surface 15 may instead have the fracture surface.

Figure 11:
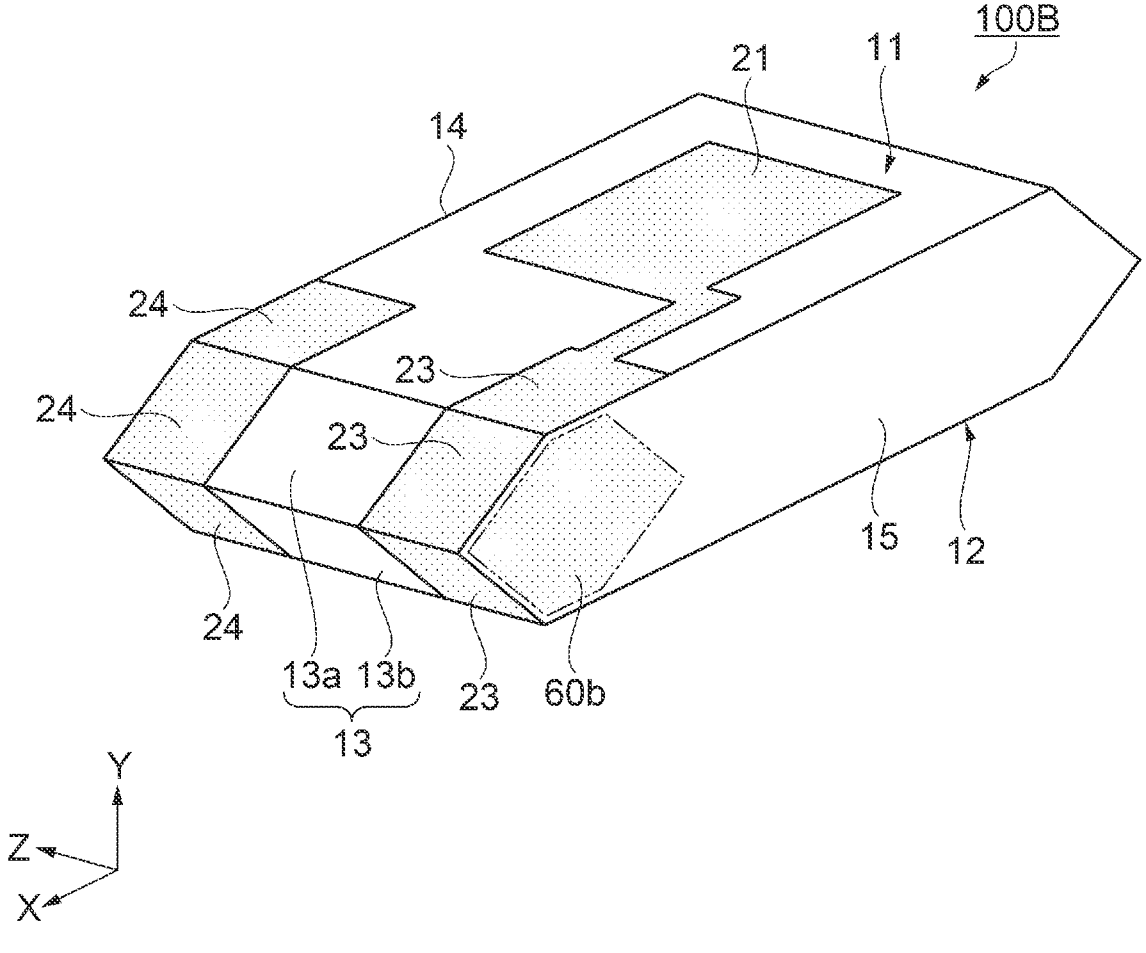
FIG. 11 is a perspective view showing the configuration of the resonator element according to another variation.

The first side surface 13 of each of the resonator elements 100A is not necessarily formed in parallel to the axis Y, in other words, perpendicularly to the first surface 11 unlike the above description, and may instead have a triangular shape, as in a resonator element 100B shown in FIG. 11.

Specifically, the first side surface 13 of the resonator element 100B has a first inclining surface 13*a* linked to the first surface 11 and a second inclining surface 13*b* linked to the second surface 12. The first extraction electrode 23 and the second extraction electrode 24 are disposed at and extend along the first inclining surface 13*a* and the second inclining surface 13*b*. The second side surface 14 and the third side surface 15 each have a fracture surface, as in the embodiment described above.

Also in this form, the extensions of the extraction electrodes 23 and 24 are located at a surface different from the fracture surfaces, so that when the resonator elements 100B are cut into separate elements, the effect of burrs, peeling, or other defects resulting from the cutting operation on the first extraction electrode 23 and the second extraction electrode 24 can be suppressed. Satisfactory vibration characteristics of the resonator elements 100B can therefore be maintained.

Figure 12:
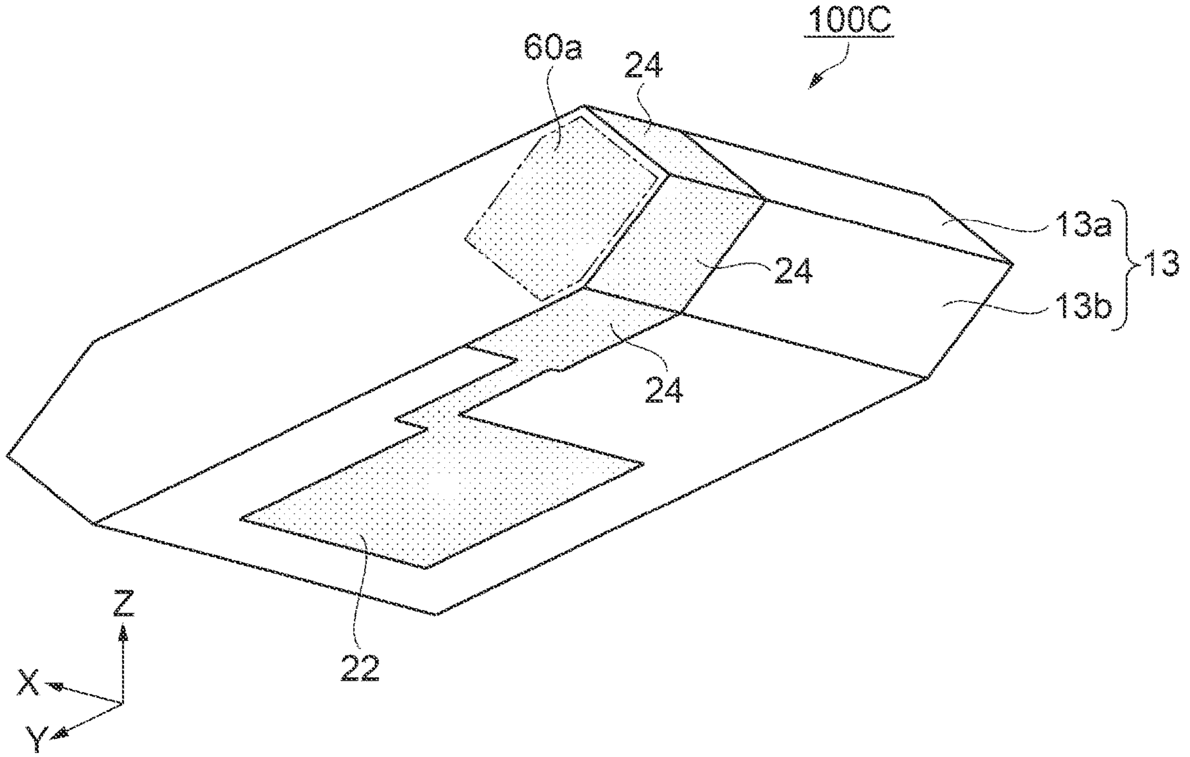
FIG. 12 is a perspective view showing the configuration of the resonator element according to another variation.

Both the first extraction electrode 23 and the second extraction electrode 24 do not necessarily extend along the first side surface 13 unlike the above description, and one of the two extraction electrodes may extend along the first side surface 13, as shown in FIG. 12. FIG. 12 shows a resonator element 100C, in which only the second extraction electrode 24 extends along the first side surface 13. The first side surface 13 shown in FIG. 12 has the inclining surfaces 13*a* and 13*b* as in the resonator element 100B according to the variation described above, and the same holds true for the case where the first side surface is parallel to the axis Y, as in the embodiment described above.

Figure 13:
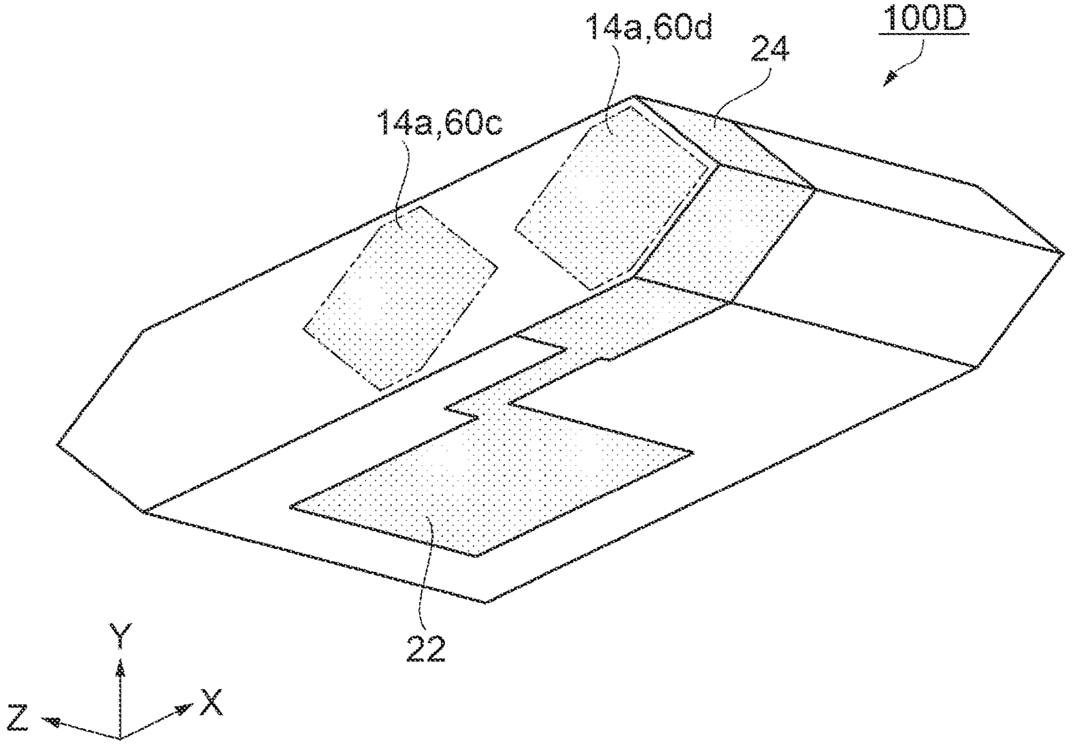
FIG. 13 is a perspective view showing the configuration of the resonator element according to another variation.

Also in a cantilever-shaped resonator element 100D according to another variation, the first side surface 13 may also have the first inclining surface 13*a* and the second inclining surface 13*b*, which each have a triangular shape, as shown in FIG. 13.

It is preferable that the holders 60 are each thinnest in the axis-Y direction at the portion coupled to the support section 40, in other words, at the portions coupled to the end sections 14*a* and 15*a* of the resonator element 100. According to the method described above, the portions of the holders 60 that are coupled to the support sections 40 are formed as thin portions, so that when the films 202 are stretched, the resonator elements 100 can be readily separated from each other at the thin portions.

As described above, in the quartz crystal wafer 1000 according to the variation, it is preferable that the portion of each of the holders 60 that intersects with the first surface 11 and the second surface 12 is thinnest at the portion coupled to the resonator element 100. According to the configuration described above, since the portions of the holders 60 that are coupled to the resonator elements 100 are thin portions, the resonator elements 100 can be readily cut into individual elements at the thin portions.

It is preferable that a recessed groove or a through hole is formed in the portion of each of the holders 60 that is coupled to the support section 40. According to the method described above, since a recessed groove or a through hole is formed in the portion of each of the holders 60 that is coupled to the support section 40, the strength of the coupled portion can be reduced, so that when the films 202 are stretched, the portions having the reduced strength are likely to be first fractured, so that the resonator elements 100 can be readily cut into individual elements.

As described above, it is preferable in the quartz crystal wafer 1000 according to the variation that the portion of each of the holders 60 that is coupled to the resonator element 100 has a recessed groove or a through hole. According to the configuration described above, since the portions of the holders 60 that are coupled to the resonator elements 100 each have a recessed groove or a through hole, the strength of the coupled portions can be reduced, so that the resonator elements 100 can be readily cut into individual elements at the thin portions.

What is claimed is:

1. A resonator element comprising:

an AT-cut quartz crystal substrate having a first surface that is a front surface and a second surface that is a rear surface with respect to the front surface, the first and second surfaces extending along axes X and Z' of a quartz crystal, and further having side surfaces that link the first and second surfaces to each other;

a first excitation electrode disposed at the first surface;

a first extraction electrode disposed at the first surface and coupled to the first excitation electrode;

a second excitation electrode disposed at the second surface; and a second extraction electrode disposed at the second surface and coupled to the second excitation electrode, wherein the side surfaces include a first side surface located at one side of a direction of the axis X, and second and third side surfaces that intersect with the first side surface, at least one of the first and second extraction electrodes is disposed at and extends along the first side surface, and at least one of the second and third side surfaces has a fracture surface.

2. The resonator element according to claim 1, wherein the second and third side surfaces each have the fracture surface.

3. The resonator element according to claim 1, wherein the first and second extraction electrodes extend along the first side surface, and the second and third side surfaces each have the fracture surface.

4. A quartz crystal wafer comprising:

a plurality of resonator elements that each include an AT-cut quartz crystal substrate having a first surface that is a front surface and a second surface that is a rear surface with respect to the front surface, the first and second surfaces extending along axes X and Z' of a quartz crystal, and further having side surfaces that link the first and second surfaces to each other, a first excitation electrode disposed at the first surface, a first extraction electrode disposed at the first surface and coupled to the first excitation electrode, a second excitation electrode disposed at the second surface, and a second extraction electrode disposed at the second surface and coupled to the second excitation electrode;

a support frame; and a plurality of holders that couple the resonator elements to the support frame, wherein the side surfaces of each of the resonator elements include a first side surface located at one side of a direction of the axis X, and second and third side surfaces that intersect with the first side surface, at least one of the first and second extraction electrodes is disposed at and extends along the first side surface, and the holders are disposed at a side facing at least one of the second and third side surfaces.

5. The quartz crystal wafer according to claim 4, wherein the holders are disposed at sides facing the second and third side surfaces of each of the resonator elements.

6. The quartz crystal wafer according to claim 4, wherein the first and second extraction electrodes extend along the first side surface, and the holders are disposed at sides facing the second and third side surfaces.

7. The quartz crystal wafer according to claim 4, wherein a width of each of the holders along a direction that intersects with the first side surface is so set that a portion of the holder that is coupled to the resonator element is minimized.

8. The quartz crystal wafer according to claim 4, wherein a portion of each of the holders that intersects with the first and second surfaces is thinnest at a portion coupled to the resonator element.

9. The quartz crystal wafer according to claim 4, wherein a portion of each of the holders that is coupled to the resonator element has a recessed groove or a through hole.

* * * * *